(12) United States Patent
Palanisamy

(10) Patent No.: US 7,002,562 B2
(45) Date of Patent: Feb. 21, 2006

(54) INTERCONNECTING LARGE AREA DISPLAY PANELS

(75) Inventor: Ponnusamy Palanisamy, Lansdale, PA (US)

(73) Assignee: Intel Corporation, Santa Clara, CA (US)

( * ) Notice: Subject to any disclaimer, the term of this patent is extended or adjusted under 35 U.S.C. 154(b) by 806 days.

(21) Appl. No.: 09/904,246

(22) Filed: Jul. 12, 2001

(65) Prior Publication Data

US 2003/0011298 A1   Jan. 16, 2003

(51) Int. Cl.
*G09G 5/00* (2006.01)
(52) U.S. Cl. ...................... 345/204; 345/205
(58) Field of Classification Search ............... 345/204, 345/205, 206, 87–100, 55, 76, 82, 84
See application file for complete search history.

(56) References Cited

U.S. PATENT DOCUMENTS

| | | | | |
|---|---|---|---|---|
| 5,253,091 A | * | 10/1993 | Kimura et al. | 345/94 |
| 5,670,792 A | * | 9/1997 | Utsugi et al. | 257/59 |
| 6,265,986 B1 | * | 7/2001 | Oka et al. | 340/815.52 |
| 6,274,391 B1 | * | 8/2001 | Wachtler et al. | 438/6 |
| 2002/0054037 A1 | * | 5/2002 | Kawano et al. | 345/205 |

* cited by examiner

*Primary Examiner*—Regina Liang
(74) *Attorney, Agent, or Firm*—Trop, Pruner & Hu, P.C.

(57) ABSTRACT

A display made from a display panel and a circuit board that are surface mounted to one another. The surface mount interconnections may be distributed across the display avoiding the need to situate the contacts around the periphery. Particularly, in large area displays made up of a plurality of abutting displays, making interconnections in the peripheral areas may be disadvantageous. The row and column contacts may be redundant to improve the yield and life time of the display. Contacts adjacent edges may be displaced into available space, spaced away from the edges.

10 Claims, 4 Drawing Sheets

INTERCONNECTING LARGE AREA DISPLAY PANELS

BACKGROUND

This invention relates generally to modular large area displays.

Large area displays use a number of modules which are connected together. Each of the modules produces a portion of an overall image which is discernible from the composite of modules. Large area displays made in a modular format have advantages since the probability of forming defects is a function of how large is the device being made. Thus, the yield may be higher with devices made in smaller sizes and then assembled into a larger structure.

Each pixel includes a light altering member which produces light of a particular color. Commonly, a single pixel will include light altering elements for each color in a tri-color color space such as red, green and blue.

In emissive displays, such as organic light emitting device (OLED) displays, each subpixel associated with a particular color is sandwiched between row and column electrodes. In one example, the row, column and OLED material may be deposited on a transparent panel such as a glass panel. The OLED material may produce light when an appropriate potential is applied across it by way of the row and column electrodes. Conventionally, the column electrodes are made light transmissive using indium tin oxide, for example. Thus, light output from the emitting material passes through the column electrodes and out through the glass panel.

The glass panel and its associated electrodes and OLED material may be referred to as a display panel. The display panel may be attached to a circuit board which conditions signals for the display panel. Thus, an electrical connection is needed between the display panel and the circuit board. This connection may be made using solder balls and surface mount connections between the display panel and the circuit board.

Traditionally, such connections are made around the periphery of the overall display. However, this has many disadvantages including the fact that the available edge space may be limited in some cases. In addition, the edge regions may be subject to disruption from impact or the use of sealing materials to interface one module with adjacent modules.

Thus, there is a need for better ways to interconnect the display panel with the circuit board in a course of making large area displays.

DETAILED DESCRIPTION

Figure 1:
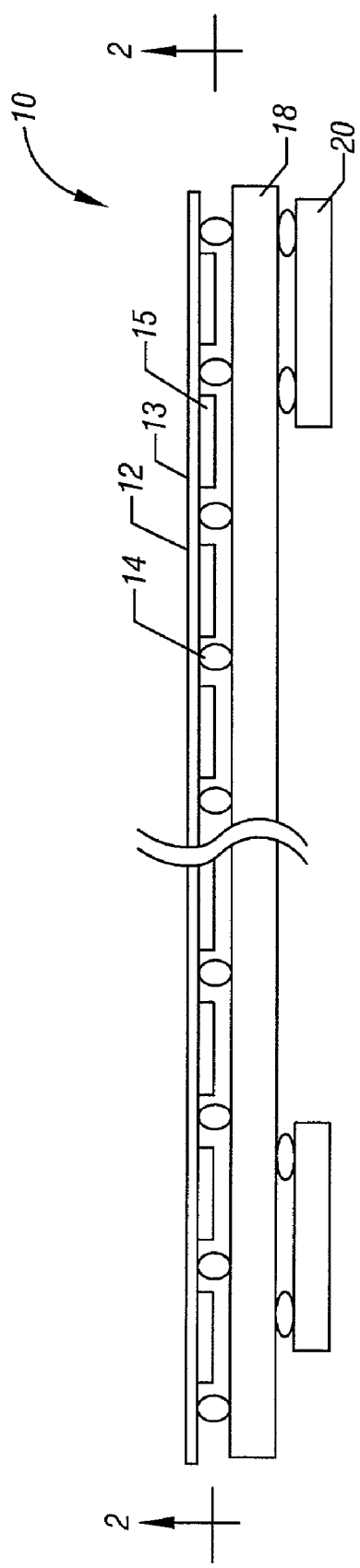
FIG. 1 is a greatly enlarged cross-sectional view of one embodiment of a large area display in accordance with the present invention.

Referring to FIG. 1, a display 10, in one embodiment, may be an organic light emitting device (OLED) display, however, the present invention is not limited to a particular display technology. The display 10 includes a display panel 12. In one embodiment, the display panel 12 includes a transparent glass sheet 13 having attached thereto a tri-pixel 15. The tri-pixel 15, in an OLED embodiment, may include a sandwich of a column electrode followed by an OLED material followed by row electrode. The row electrode may be formed of a metal or other conductive material. The column electrode is conventionally formed of a transparent conductive material, such as indium tin oxide (ITO).

Light is generated by the OLED material in response to the development of a potential across the material by the row and column electrodes. As a result, the OLED material emits light which passes through the column electrode of the tri-pixel 15 and the glass sheet 13 to be emitted by the display 10.

Control over the tri-pixels 15 may be provided through a circuit board 18 which receives signals from driver circuits 20. For example, the driver circuits 20 may indicate the color and intensity to drive the various tri-pixels 15. This information may be distributed by the circuit board 18 to the appropriate tri-pixels 15. Thus, the circuit board 18 may provide a signal distribution function to distribute signals processed by the driver circuits 20 to the individual tri-pixels 15. In one embodiment, the circuit board 18 may be a ceramic circuit board such as an alumina circuit board including appropriate vias and interconnections.

The connections between the display panel 12 and the circuit board 18 may be implemented using interconnects 14 in the form of solder balls or other surface mount interconnection technologies. The interconnects 14 may be affixed to the circuit board 18 and/or display panel 12 using heat. Then the display panel 12 and circuit board 18 are brought together to physically and electrically interconnect the circuit board 18 to the display panel 12 by reflowing the solder to form the interconnects 14. At the same time, solder balls between the driver circuits 20 and the circuit board 18 may be reflowed, in one embodiment.

Figure 2:
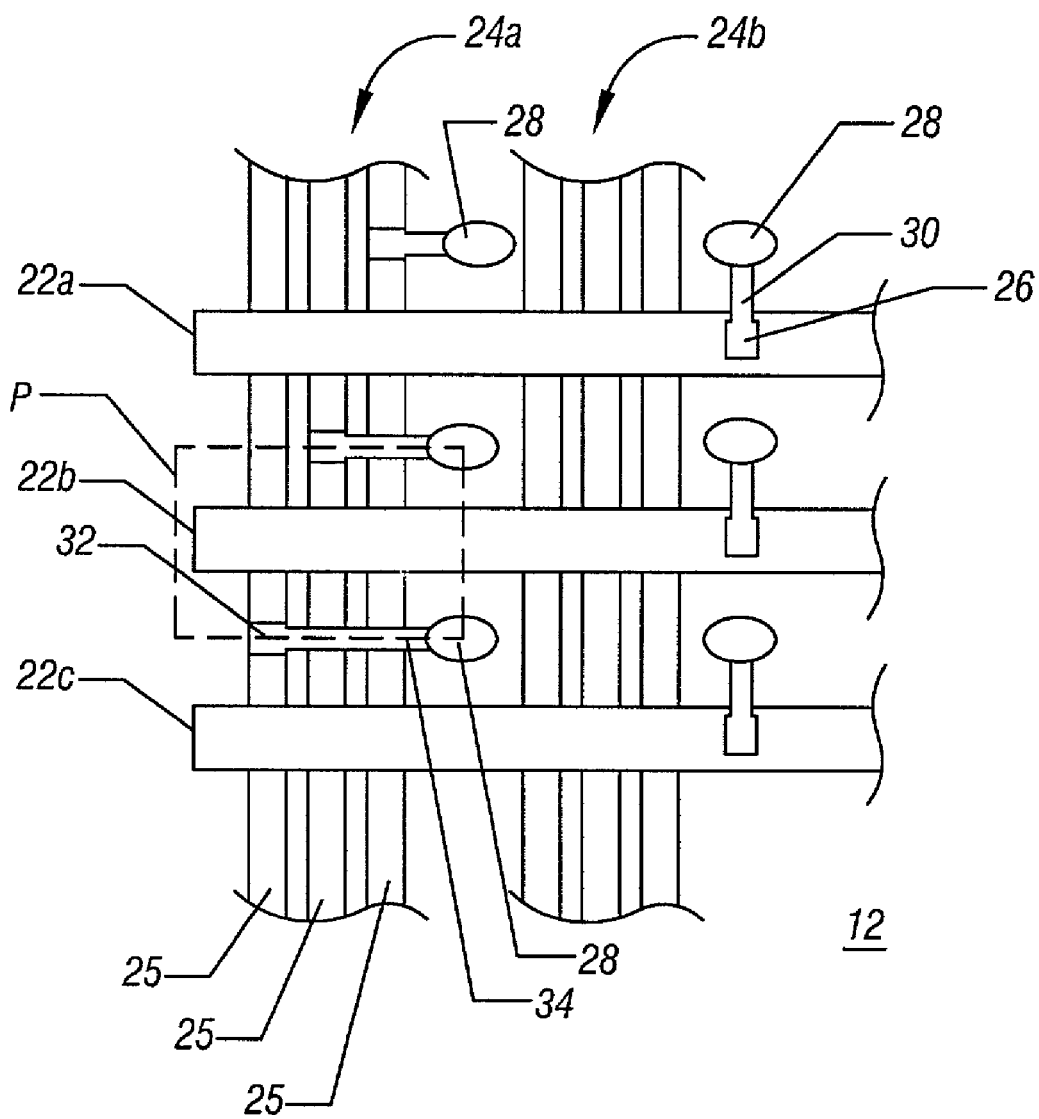
FIG. 2 is a greatly enlarged, partial cross-sectional view taken generally along the lines 2—2 in FIG. 1.

Referring to FIG. 2, the display panel 12 may include a matrix of row electrodes 22a, 22b and 22c. As described previously, the row electrodes 22 may be made of a metal. The row electrodes 22 are deposited on top of the light emitting material, which is not shown in FIG. 2. Beneath the light emitting material is an array of column electrodes 24a and 24b. Each column electrode 24 actually includes three separate lines, one line for each color of the tri-pixel indicated as P. Thus a line 25 is provided for each of the three colors of the pixel P. Thus the pixel P is defined by the region where row electrodes 22 and triset of column electrodes 24 overlap.

In one embodiment, an entire row of pixels is addressed or activated at one time. Thus, potential is applied to a given row electrode 22. Every pixel along the row then has its row activated. Each column electrode 24 is then selectively activated to activate a particular pixel at a particular intensity, if desired. Thus, in one pixel, the red subpixel may be activated whereas in the next pixel, the green subpixel may not be illuminated. The intensity of illumination of each pixel may be adjusted through appropriate column signals.

The column signals originating, for example, in the driver circuits 20 may pass through the circuit board 18. From the circuit board 18, those signals may pass through interconnects 14 to interconnect contact pads 28 on the display panel 12. From the contact pads 28, signals may pass, for example, through metallizations 34 to column line contacts 32. The column line contact 32 contacts a particular line 25 of a set of three column lines 24. Generally, as shown in FIG. 2, the column connections are made by metallizations 34 which extend between adjacent rows 22 and run generally parallel thereto. Thus, the metallizations 34 run transversely to the direction of the column electrodes 24 in the space provided between adjacent rows 22.

The same space may be utilized to provide the pads 28 from the interconnects 14 for the row electrodes 22. The metallizations 30 for the row electrodes 22 run generally transversely to the row electrodes 22 and parallel to the length of the column electrodes 24. Each row interconnect system includes a pad 28 which makes contact to a solder ball or other interconnect 14 and a metallization 30 which runs from the pad 28 to a row contact 26. The row contact 26 contacts a particular row electrode 24 and provides an electrical connection thereto.

Thus, a system of pads 28, metallizations 30 and 34, and contacts 26 and 32 may all be deposited directly on to the display panel 12 in accordance with one example of a fabrication process. This may facilitate the fabrication of the display panel 12. Further, spaces are provided between basic column electrodes 24 that may be utilized for making connections to row electrodes 22 and likewise spaces may be provided between adjacent row electrodes 22 that may be utilized for making column electrode 24 connections.

Figure 3:
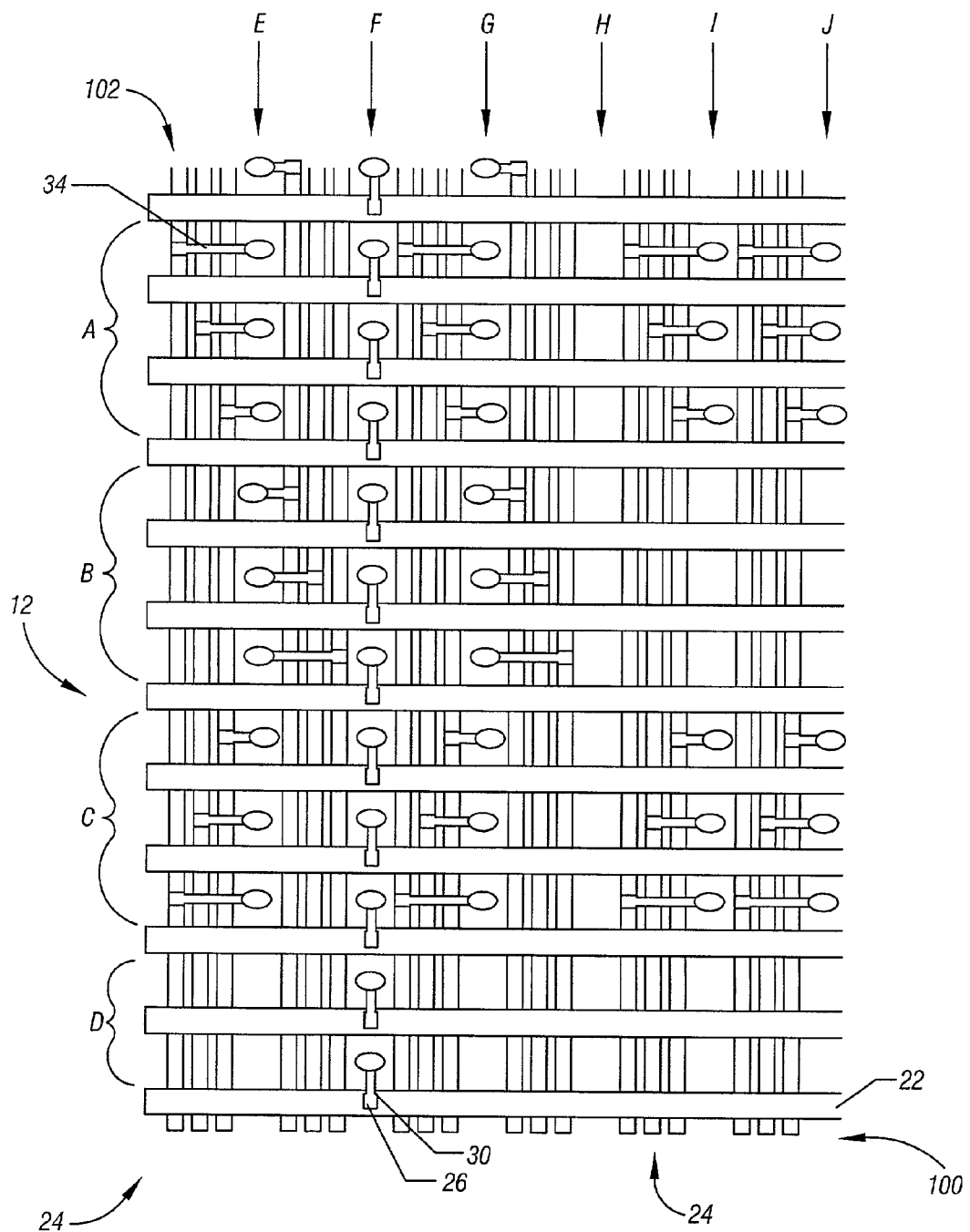
FIG. 3 is a less enlarged cross-sectional view corresponding to FIG. 2 but showing a larger area in accordance with one embodiment of the present invention.

Turning next to FIG. 3, a portion of the display panel 12 is illustrated. The display panel 12 includes a horizontal edge 100 and a vertical edge 102. Ideally, connections are spaced well away from the edges 100 and 102 because of the possibility of disruption. In particular, when one display 10 is abutted to an adjacent display 10, sealing material may be utilized along that interface. This may interfere with the contacting process. Thus, it may be desirable to keep a field along the edges 100, 102 as free as possible from interconnections.

In this regard, the edge proximate column metallizations 34 extend away from the edge 102. Similarly, the edge proximate row metallization 30 extend away from the edge 100. In the display portion shown in FIG. 3, one row contact 26 is provided to each row electrode 22.

However, redundancy may be desirable and additional row connections may be provided to the same row electrode in a portion of the display 10 that repeats the pattern shown in FIG. 3. Similarly, redundant column connections are provided along the length of the column electrodes 24. Thus, when any row electrode 22 is activated, the potential applied to a column electrode 24 may be repeated a large number of times along the exact same column electrode 24 to provide redundancy and fail safe operation as well as to distribute the potential equally along the lines 25.

Because ITO, which may be utilized for the column electrodes 24, is not as good a conductor as aluminum or silver, there may be resistive voltage drops along the column electrodes 24. To reduce the magnitude of these resistive voltage drops, it is desirable to provide multiple connections along the length of the column electrodes 24 at spaced locations along the column electrodes.

Figure 4:
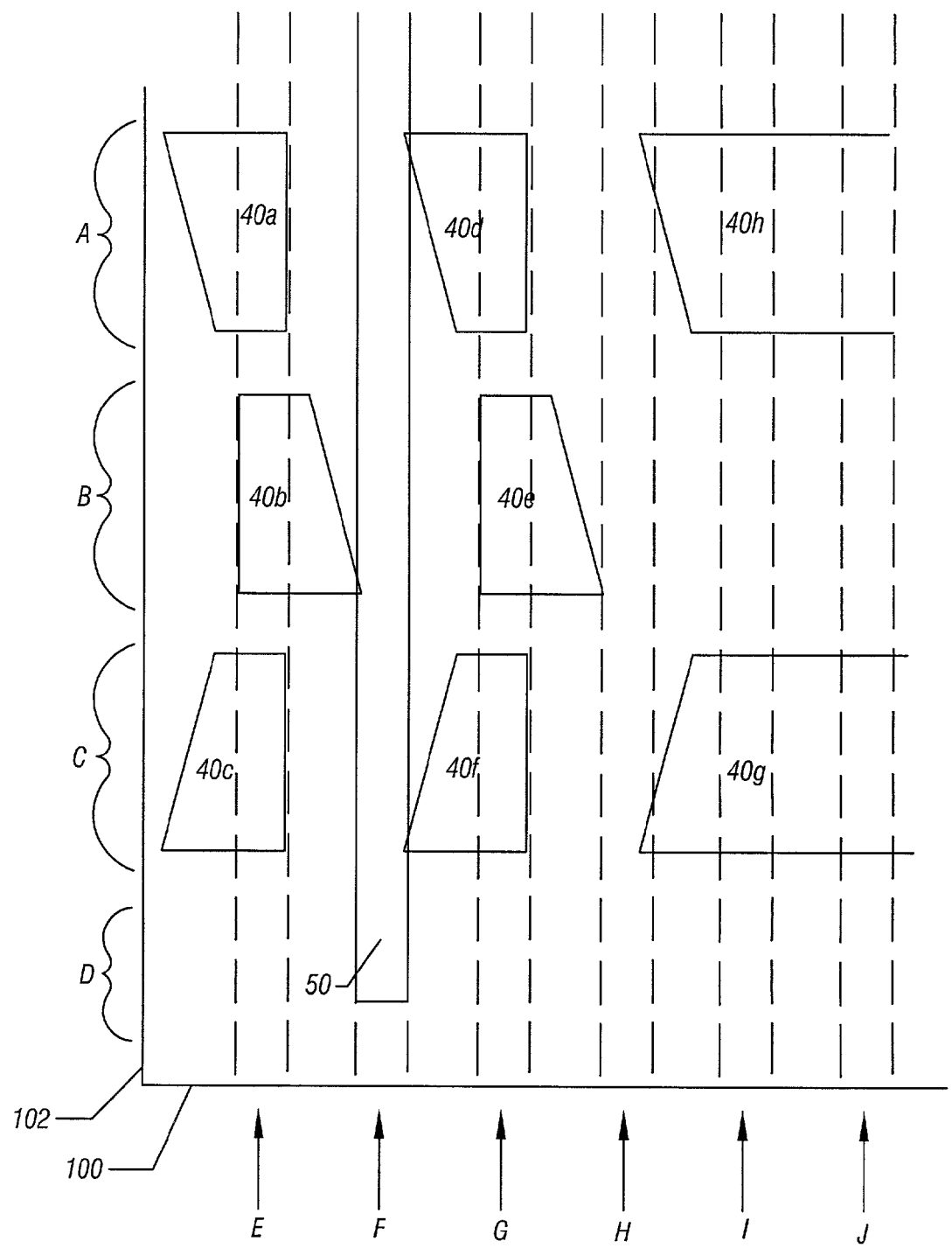
FIG. 4 is a schematic depiction of contact layout in accordance with one embodiment of the present invention.

Referring to FIG. 4, the layout of the row and column interconnections in the display portion of FIG. 3 may be better understood. A series of column connections 40a and 40c are provided from the vertically oriented space E between adjacent column electrodes 24 to three column lines 25. Each column connection 40 includes three sets of pads 18, metallizations 34 and contacts 32.

In one embodiment, the column connections 40 are provided to every other set of vertically displaced pixels such as the pixels indicated at A and C. In addition, the column connection 40b is interposed in the otherwise vacant pixel space B. In one embodiment, a series of horizontal spaces A, B, C, and D may be provided in a repeated fashion along the display panel 12. Every other space, such as the space B and D, may be left vacant.

The region F between adjacent sets of column electrodes 24, may be devoted to a vertical strip of row connects 50.

A field for the column connection 40g may be provided along the pixel region C. The column connections 40 may skip the field B, and may be repeated again as indicated at 40h in the field A.

Thus, redundant contacts may be provided while at the same time avoiding, to the greatest possible extent, placing contacts in the areas along peripheral edges. In some cases, available space between adjacent banks of contacts may be utilized near the edges to contain contacts that would otherwise be provided along the edge fields. Redundant column and row contacts are desirable. In many cases, multiple redundant contacts across the surface of the display panel 12 may be advantageous.

In addition, it may be desirable to maximize the area of the contacts to the greatest possible extent to minimize the total contact resistance.

Thus, with embodiments of the present invention, interconnections may be made within the pixel areas between the active areas and driver circuits across the face of the display panel 12. Thus, it is not necessary to undertake the relatively hazardous design of positioning the contacts around the periphery of the actual display producing elements.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A display comprising:
   a circuit board;
   a display panel electrically coupled to said circuit board in face-to-face abutment substantially along a plane; and
   an electrical connection including a first contact on said circuit board, a second contact on said display panel, and a conductor coupling said first and second contacts and extending generally along said plane.

2. The display of claim 1 wherein said electrical connection is a surface mount connection including solder balls.

3. The display of claim 2 wherein said solder balls couple to the contact pads on one of said display panels or circuit boards.

4. The display of claim 3, said display panel including column electrodes and said conductor including a metallization coupled to said second contact on said display panel and extending to a third contact which contacts a column electrode.

5. The display of claim 4 wherein said column electrode is formed at least in part of indium tin oxide.

6. The display of claim 5 including a plurality of redundant third contacts to said column electrode.

7. The display of claim 6 including a plurality of second contacts aligned in a column parallel to said column electrode.

8. The display of claim 7, said display including pixels, wherein an electrical connection is made from said second contacts to said column electrode for every other pixel along the length of said column electrode.

9. The display of claim 8, said display including an edge, and including a zone, adjacent to said edge, free of electrical connections.

10. The display of claim 1 including a row electrode and a plurality of electrical connections from said second contacts to the row electrode, said second contacts that couple to said row electrode being arranged parallel to said column electrode.

* * * * *